United States Patent

Guenter et al.

[11] Patent Number: 5,903,588
[45] Date of Patent: May 11, 1999

[54] LASER WITH A SELECTIVELY CHANGED CURRENT CONFINING LAYER

[75] Inventors: James K. Guenter, Garland; Ralph H. Johnson, Murphy, both of Tex.

[73] Assignee: Honeywell Inc., Minneapolis, Minn.

[21] Appl. No.: 08/812,620

[22] Filed: Mar. 6, 1997

[51] Int. Cl.$^6$ .................................................. H01S 3/191
[52] U.S. Cl. ............................................. 372/46; 372/96
[58] Field of Search ................................. 372/46, 96, 50

[56] References Cited

U.S. PATENT DOCUMENTS

| | | | |
|---|---|---|---|
| 5,115,442 | 5/1992 | Lee et al. ................................. | 372/45 |
| 5,179,567 | 1/1993 | Uomi et al. . | |
| 5,245,622 | 9/1993 | Jewell et al. ............................. | 372/45 |
| 5,258,990 | 11/1993 | Olbright et al. ......................... | 372/46 |
| 5,262,360 | 11/1993 | Holonyak et al. ...................... | 437/237 |
| 5,373,522 | 12/1994 | Holonyak et al. ...................... | 372/45 |
| 5,416,044 | 5/1995 | Chino et al. . | |
| 5,493,577 | 2/1996 | Choquette et al. . | |
| 5,550,081 | 8/1996 | Holonyak, Jr. et al. . | |
| 5,719,891 | 2/1998 | Jewell ..................................... | 372/45 |
| 5,729,566 | 3/1998 | Jewell ..................................... | 372/96 |

OTHER PUBLICATIONS

MacDougal et al, Electrically–Pumped Vertical–Cavity Lasers with $Al_xO_y$–GaAs Reflectors, Mar. 1996, pp. 310–312, IEEE Photonics Technology Letters.

Yang et al., Ultra Low Threshold Current Vertical–Cavity Surface–Emitting Lasers Obtained With Selective Oxidation, Electronics Letters; May 25, 1995; pp. 886–888; vol. 31, No. 11.

Chua et al, Low–Threshold 1.57um VC–SEL & Using Strain Compensated Quantum Wells and Oxide/Metal Back Mirror IEEE Photonics Technology Letters, May 1995, pp. 444–446.

Paper Entitled Progress in Planarized Vertical Cavity Surface Emitting Laser Devices and Arrays, by Morgan et al.

Article Entitled "Transverse Made Control of Vertical–Cavity Top–Surface–Emitting Lasers" by Morgan et al.

*Primary Examiner*—James W. Davie
*Attorney, Agent, or Firm*—William D. Lanyi; John G. Shudy, Jr.; Roland W. Norris

[57] ABSTRACT

A laser structure is provided with two current confining layers of a material that is subject to oxidation in the presence of an oxidizing agent. The laser structure is shaped to expose edges of the current confining layers to permit the edges to be exposed to the oxidizing agent. The current confining layers are oxidized selectively to create electrically resistive material at the oxidized portions and electrically conductive material at the unoxidized portions. The unoxidized portions of the layers are surrounded by the oxidized and electrically resistive portions in order to direct current from one electrical contact pad by passing through a preselected portion of an active region of the laser. The laser structure can be a vertical cavity surface emitting laser. The device achieves the current confining and directing function without the need to use ion bombardment or implantation to provide the current confining structure within the body of the laser.

21 Claims, 8 Drawing Sheets

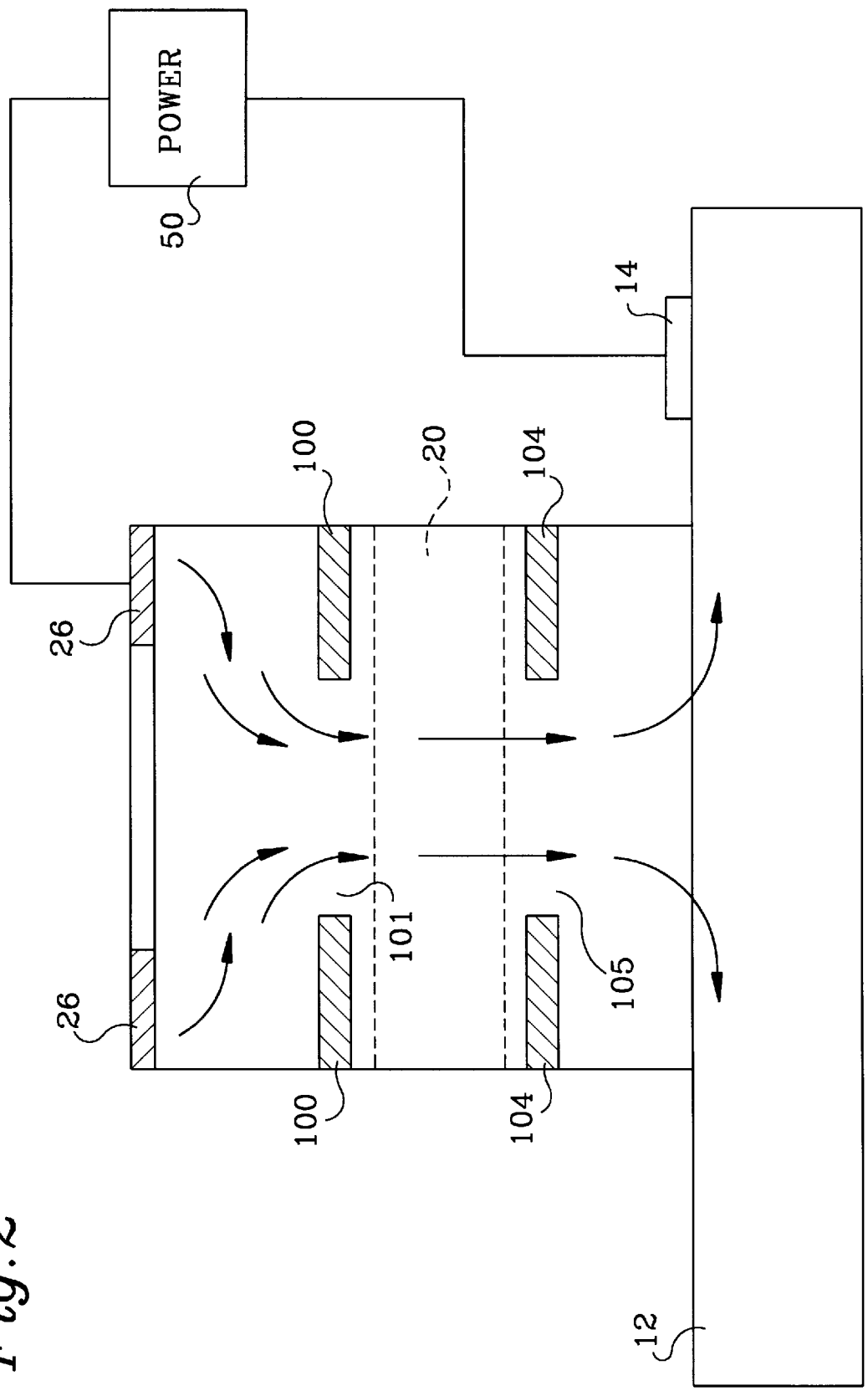

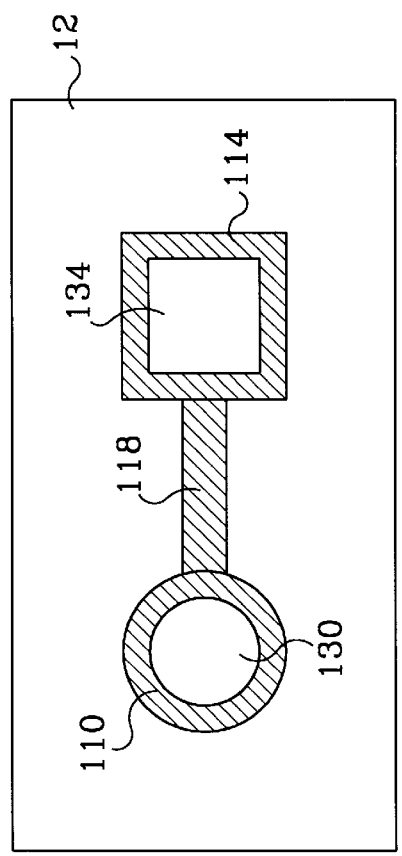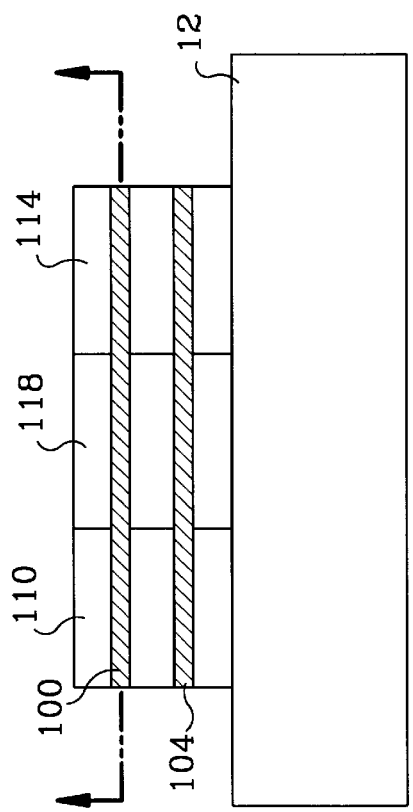
Fig. 4A
Fig. 4B

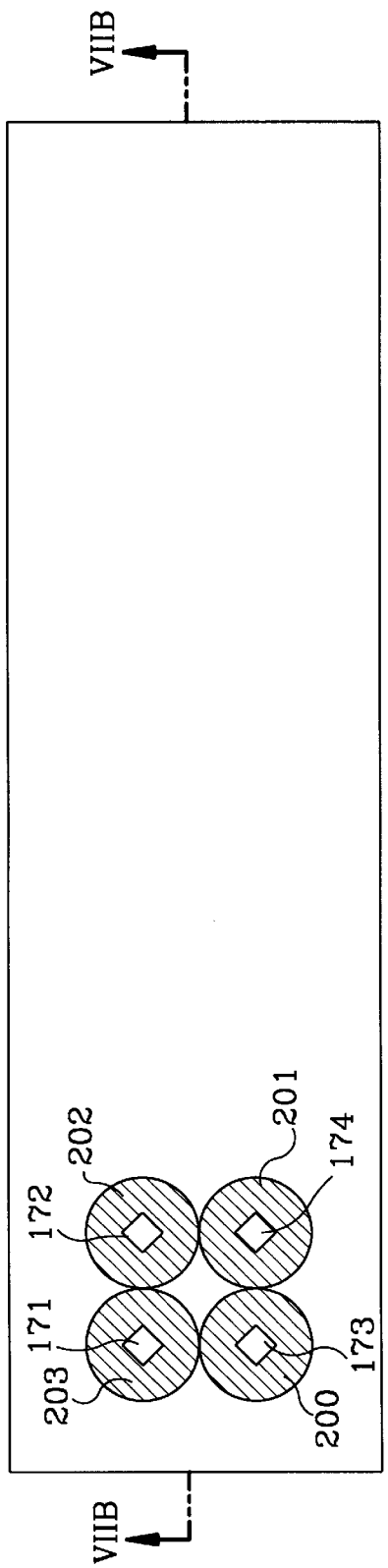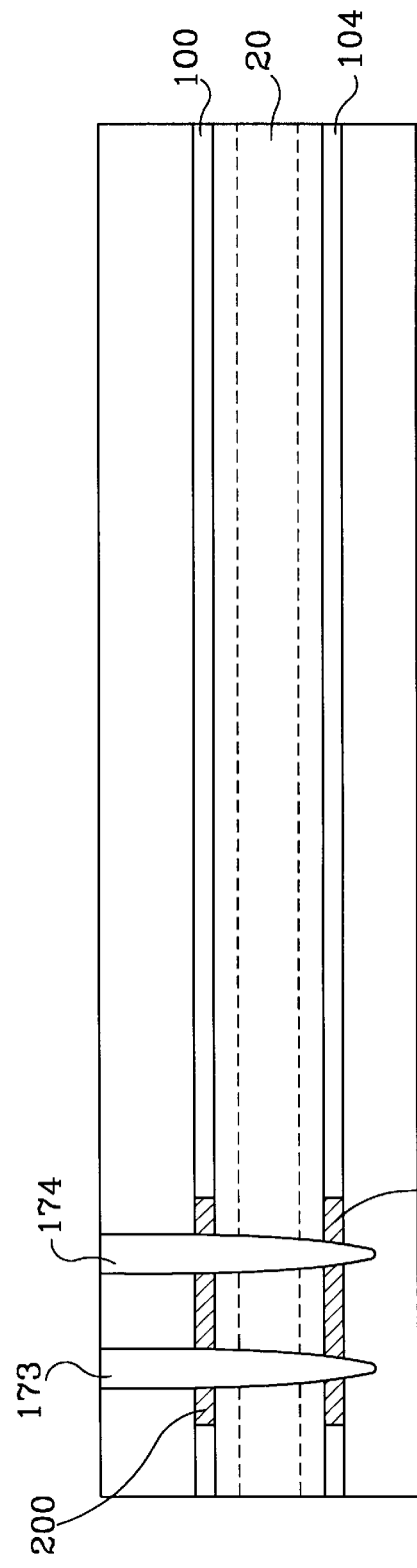

LASER WITH A SELECTIVELY CHANGED CURRENT CONFINING LAYER

BACKGROUND OF THE INVENTION

1. Field of the Invention

The present invention is generally related to a laser with a current confining layer and, more particularly, to a vertical cavity surface emitting laser, or VCSEL, with a layer of oxidizable material that is selectively oxidized in order to form an electrically insulative layer with an electrically conductive opening extending therethrough to confine the flow of electrical current through an active region of the laser.

2. Description of the Prior Art

Many different types of semiconductor lasers are known to those skilled in the art. One type of laser is a vertical cavity surface emitting laser, or VCSEL, which emits light in a direction that is generally perpendicular to an upper surface of the laser structure. Lasers of this type comprise multiple layers of semiconductive material. Typically, a substrate is provided at one end of a stack of semiconductive layers. On the substrate, a first mirror stack and a second mirror stack are arranged with a quantum well active region therebetween. On both sides of the active region, graded or ungraded layers can be provided as a spacer between the mirrors. On the second mirror stack, an electrical contact is disposed. Another electrical contact is provided at the opposite end of the stack of layers in contact with the substrate. An electrical current is caused to flow between the two contacts. This electrical current therefore passes through the second mirror stack, a top graded index region, the active region, a bottom graded index region, the first mirror stack and the substrate. Typically, a preselected portion of the active layer is designated as the active region and the electrical current is caused to flow through the active region in order to induce lasing.

In a paper entitled "Progress in Planarized Vertical Cavity Surface Emitting Laser Devices and Arrays" by Morgan, Chirovski, Focht, Guth, Asom, Leibenguth, Robinson, Lee and Jewell, which was published in Volume 1562 of the International Society for Optical Engineering, Devices for Optical Processing (1991), a VCSEL structure is described in detail. The article describes a batch-processed VCSEL comprising gallium arsenide and aluminum gallium arsenide. Several different sizes of devices were studied experimentally and are described in the publication. Continuous-wave threshold currents were measured to 1.7 mA with output powers greater than 3.7 mW at room temperature. The paper also discusses certain interesting characteristics such as differential quantum efficiencies exceeding unity and multitransverse mode behavior. In FIG. 1 of this paper, a perspective sectional view of a VCSEL is illustrated with the various layers identified. In order to confine the current flow through the active region of the quantum well, the device described and illustrated in this paper uses a hydrogen ion implant technique to create electrically insulative regions with an electrically conductive opening extending therethrough. From the upper electrical contact of the VCSEL, current is caused to flow through the electrically conductive opening and thereby is directed through a preselected active region of an active layer.

U.S. Pat. No. 5,245,622, which illustrated to Jewell et al on Sep. 14, 1993, discloses a vertical cavity surface emitting laser with an intra-cavity structure. In the Figures of the Jewell et al patent, a current blocking region is identified by reference numeral 44 and described as forming an annular proton implantation into the active region. The implantation is utilized to horizontally confine the flow of electrical current. The VCSELs disclosed in the Jewell et al patent have various intra-cavity structure to achieve low series resistance, high power efficiencies, and a specific type of modal radiation. In one embodiment of the described VCSEL, the laser comprises a laser cavity disposed between an upper and a lower mirror. The cavity comprises upper and lower spacer layers sandwiching an active region. A stratified electrode for conducting electrical current to the active region comprises the upper mirror and the upper spacer. The stratified electrode comprises a plurality of alternating high and low doped layers for achieving low series resistance without increasing the optical absorption. The VCSEL further comprises a current aperture as a disk shaped region formed in the stratified electrode for suppressing higher mode radiation. The current aperture is formed by reducing or eliminating the conductivity of the annular surrounding regions. In one embodiment, a metal contact layer with an optical aperture is formed on the upper mirror of the VCSEL. The optical aperture blocks the optical field in such a manner that it eliminates higher transverse mode lasing.

U.S. Pat. No. 5,258,990, which issued to Olbright et al on Nov. 2, 1993, describes a visible light surface emitting semiconductor laser. In the Figures of the Olbright et al patent, an active quantum well is identified by reference numeral 34 and is defined by an annular zone identified by reference numeral 33. The annular zone comprises implanted protons which surround the active quantum well and thereby confines the electrical current flow to the quantum well. The VCSEL described in the Olbright et al patent comprises a laser cavity that is sandwiched between two distributed Bragg reflectors. The laser cavity comprises a pair of spacer layers surrounding one or more active, optically emitting quantum well layers having a bandgap in the visible range which serve as the active optically emitting material of the device. Electrical pumping of the laser is achieved by heavily doping the bottom mirror and substrate to one conductivity type and heavily doping regions of the upper mirror with the opposite conductivity type in order to form a diode structure. Furthermore, a suitable voltage is applied to the diode structure. Particular embodiments of the device are described in the olbright et al patent, including those which generate red, green and blue radiation.

U.S. Pat. No. 5,115,442, which issued to Lee et al on May 19, 1992, discloses a vertical cavity surface emitting laser. Lasers of this type are described as depending upon emission through an apertured top surface electrode. Biasing current, accordingly peripheral to the laser as introduced, follows a path which comes to confluence within the active gain region to effectively attain lasing thresholds. The path of the electrical current passes through an opening of a buried region of increasing resistance which encircles the laser at or above the active region. The buried region is produced by ion implantation-induced damage with ion energy magnitude and spectrum chosen to produce an appropriate resistance gradient. Integrated, as well as discrete, lasers are described in this cited reference. The Figures of the Lee et al patent illustrate the location and shape of the region of ion implantation damage which is used to confine the flow of electrical current through an active region within the active layer.

In the April 1993 publication of IEEE Photonics Technology Letters, Vol. 4, No. 4, an article titled "Transverse Mode Control of Vertical-Cavity Top-Surface-Emitting Lasers" by Morgan, Guth, Focht, Asom, Kojima, Rogers and Callis describes transverse mode characteristics and control for VCSELs. The paper discusses a novel spatial filtering concept for the control of VCSEL transverse modes which allow the achievement of over 1.5 mW in certain transverse mode emissions from continuous wave electrically excited VCSELs. This cited paper also illustrates the use of ion implantation for the purpose of current confinement and illustrates a sectional view of this technique in its first figure.

The most commonly known technique for providing the current confinement region of a VCSEL is to use ion bombardment to affect an annularly shaped region and increase its resistance to electrical current. By providing an electrically conductive opening in this region of increased electrical resistance, current is directed through the opening of higher electrical conductivity and can then therefore be directed through a preselected active region within the active layer. It would be beneficial if an alternative method could be provided for achieving current confinement without having to resort to the ion bombardment technique described in the papers and patents cited immediately above.

U.S. Pat. No. 5,373,522, which issued to Holonyak et al on Dec. 13, 1994, discloses a semiconductor device with native aluminum oxide regions. This patent describes a method for forming a native oxide from an aluminum-bearing Group III–V semiconductor material. The method entails exposing the aluminum-bearing Group III–V semiconductor material to a water containing environment and a temperature of at least 375 degrees centigrade to convert at least a portion of the aluminum-bearing material to a native oxide characterized in that the thickness of the native oxide is substantially the same as or less than the thickness of that portion of the aluminum bearing Group III–V semiconductor material thus converted. The native oxide thus formed has particular utility in electrical and optoelectrical devices, such as lasers.

U.S. Pat. No. 5,262,360, which issued to Holonyak et al on Nov. 16, 1993, discloses an AlGaAs native oxide. A method is described for forming a native oxide from an aluminum-bearing Group III–V semiconductor material. It entails exposing the aluminum bearing Group III–V semiconductor material to a water containing environment and a temperature of at least about 375 degrees centigrade to convert at least a portion of the aluminum bearing material to a native oxide characterized in that the thickness of the native oxide is substantially the same as or less than the thickness of that portion of the aluminum bearing Group III–V semiconductor material thus converted. The native oxide thus formed has particular utility in electrical and optoelectrical devices, such as lasers.

U.S. Pat. No. 5,115,442, U.S. Pat. No. 5,245,622, U.S. Pat. No. 5,262,360, U.S. Pat. No. 5,373,522 and U.S. Pat. No. 5,258,990 are hereby expressly incorporated by reference in this description.

SUMMARY OF THE INVENTION

The present invention provides a laser, which can be a vertical cavity surface emitting laser, that comprises an active region disposed between first and second electrical contacts. A first current blocking layer is provided between the first and second electrical contacts. The material of the current blocking layer is specifically selected to be subject to oxidation when exposed to an oxidizing agent. The present invention further comprises a first means for selectively exposing a portion of the first current blocking layer to the oxidizing agent in order to define a first nonoxidized region of the first current blocking layer which is surrounded by a first oxidized region of the current blocking layer. The first nonoxidized region of the first current blocking layer is aligned with a preselected region of an active region. The first oxidized region of the current blocking layer is electrically insulative while the first nonoxidized region of the current blocking layer is electrically conductive.

The laser structure can be a vertical cavity surface emitting laser, but this is not necessary in all embodiments of the present invention. A second current blocking layer can be provided in the laser structure and made of a material that is subject to oxidation when exposed to an oxidizing agent. This embodiment of the present invention further comprises a means for selectively exposing a portion of the second current blocking layer to the oxidizing agent in order to define a second nonoxidized region of the second current blocking layer surrounded by a second oxidized region of the second current blocking layer. The nonoxidized region is aligned with the active region of the laser. As in the first current blocking layer, the second oxidized region is electrically insulative while the second nonoxidized region is electrically conductive. When two current blocking layers of oxidized and nonoxidized regions are used in a single laser, the nonoxidized regions of the first and second current blocking layers are aligned to direct current through a preselected portion of the active region.

Two specific embodiments of the present invention will be described below. In one embodiment, the laser structure comprises a substrate portion, a lasing portion disposed on the substrate portion, a contact support portion disposed on the substrate portion, and a bridging portion disposed on the substrate portion. The bridging portion is connected between the lasing portion and the contact support portion and the first current blocking layer within the lasing portion is exposed at an edge surface to cause it to be selectively oxidized. In this particular embodiment of the present invention, either one or two current blocking layers can be used.

In another embodiment of the present invention, at least one etched depression extends from a first surface of the laser structure into the body of the laser structure and through the first current blocking layer in order to expose a portion of the current blocking layer to the oxidizing agent during the manufacture of the laser structure. In certain embodiments of the invention, four etched depressions can be used to selectively expose four regions of the current blocking layer to an oxidizing agent.

It should be understood that, although two specific embodiments of the present invention will be described below, alternative configurations could also be used to employ the advantages of the present invention and these alternative configurations should be considered to be within the scope of the present invention.

BRIEF DESCRIPTION OF THE DRAWINGS

The present invention will be more fully and completely understood from a reading of the Description of the Preferred Embodiment in conjunction with the drawings, in which:

FIG. 2 is a highly schematic sectional view of the present invention;

FIGS. 4A and 4B show an intermediate step in the manufacture of the embodiment shown in FIGS. 3A and 3B;

FIGS. 7A and 7B show a later stage of development of the device in FIGS. 6A and 6B.

DESCRIPTION OF THE PREFERRED EMBODIMENT

Figure 1:
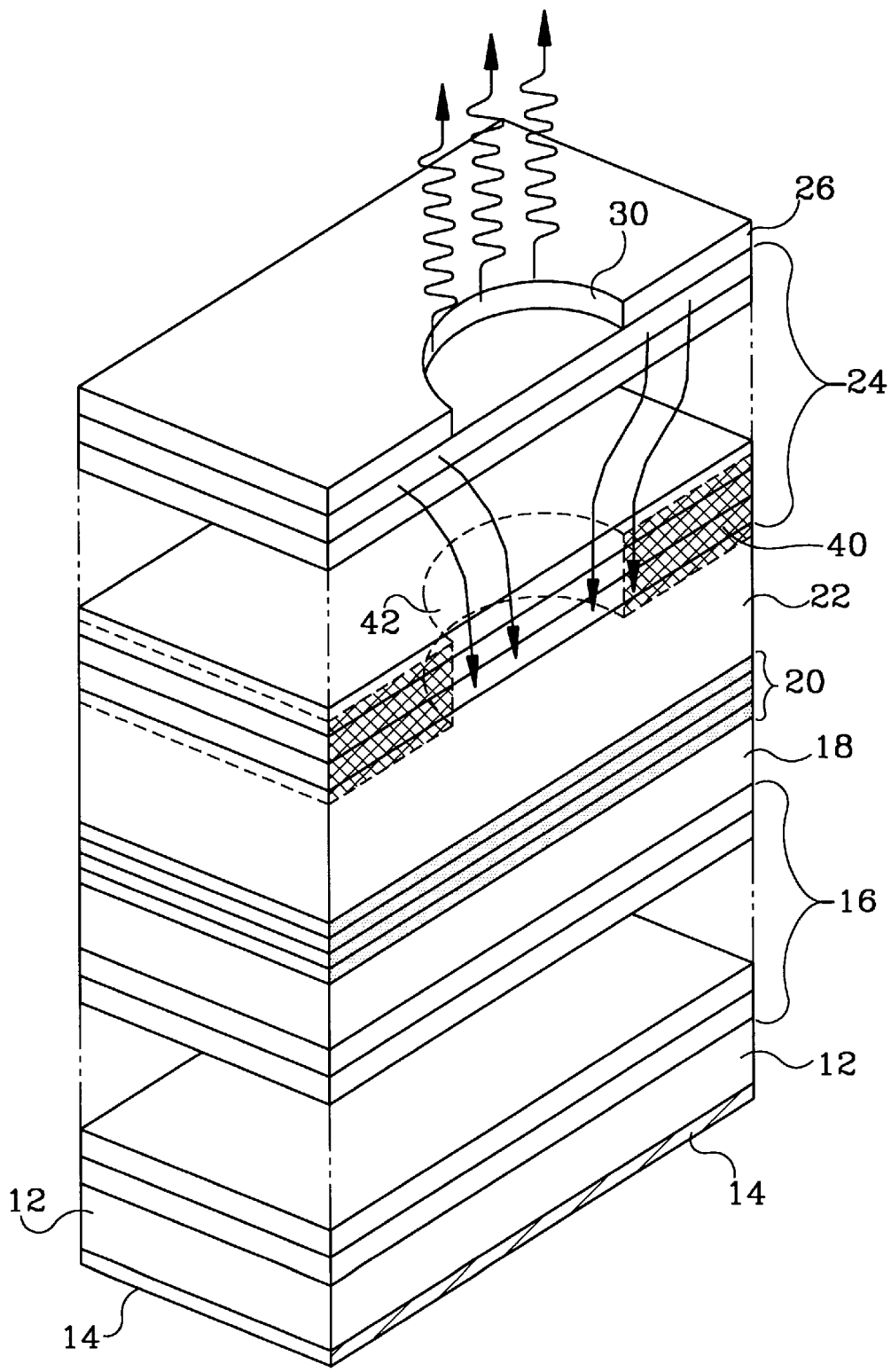
FIG. 1 illustrates a prior art vertical cavity surface emitting laser.

Throughout the Description of the Preferred Embodiment, like components will be identified by like reference numerals.

FIG. 1 is a representation showing a perspective illustration generally similar to that which is identified as FIG. 1 in the paper, Volume 1562, titled "Progress in Planarized Vertical Cavity Surface Emitting Laser Devices and Arrays" which is cited above. The perspective view show in FIG. 1 illustrates a typical structure for a vertical cavity surface emitting laser 10 which is well known to those skilled in the art. A gallium arsenide substrate 12 is disposed on an N-type electrical contact 14. A first mirror stack 16 and a bottom graded index region 18 are progressively disposed, in layers, on the substrate 12. A quantum well active region 20 is formed and a top graded index region 22 is disposed over the active region 20. A top mirror stack 24 is formed over the active region and a P-type conductivity layer 26 forms an electrical contact. Current can be caused to flow from the upper contact 26 to the lower contact 14. This current passes through the active region 20. Arrows in FIG. 1 illustrate the passage of light through an aperture 30 in the upper contact 26. Other arrows in FIG. 1 illustrate the passage of current downward from the upper contact 26 through the upper mirror stack 24 and the active region 20. A hydrogen ion implantation 40 forms an annular region of electrically resistant material. A central opening 42 of electrically conductive material remains undamaged during the ion implantation process. As a result, current passing from the upper contact 26 to the lower contact 14 is forced to flow through the conductive opening 42 and is thereby selectively directed to pass through a preselected portion of the active region 20. The structure shown in FIG. 1 is well known to those skilled in the art and is an accepted way to achieve the current confinement in a vertical cavity surface emitting laser. The present invention provides an improvement over the techniques required to produce a VCSEL represented in the structure shown in FIG. 1.

Each of the laser structures described in the patents and papers cited above utilize some type of ion bombardment or implantation for the purpose of creating a damaged annular region of increased electrical resistance which surrounds a region of lesser electrical resistance. This annular structure directs the electrical current through the preselected portion of an active region in the laser. The present invention is a departure from these techniques described in the prior art.

FIG. 2 illustrates a highly simplified schematic representation of a laser structure made in accordance with the present invention. A substrate 12 is provided with an electrical contact 14. An upper contact 26 is also provided and has an opening 30 extending through its thickness. An active region 20 is represented by dashed lines in the central portion of the laser structure shown in FIG. 2. A source of power 50 is connected between the two electrical contacts, 14 and 26, to induce the flow of current through the various layers of the laser structure.

Throughout the following description of the preferred embodiment of the present invention, the structures will be illustrated and described in terms of the use of layers that are oxidized in order to change their conductance. However, it should be understood that this same goal can be achieved through the use of an etchant that selectively removes the layers rather than oxidize them. Either method could be used to create the desired effect in the preselected layers. Naturally, if the oxidation process is used, an oxidizing agent would be used to oxidize the material in the layers. On the other hand, if the etching process is selected, an etchant would be used to selectively etch the preselected layers.

The basic concept of this invention is the geometry that is necessary to maintain a substantially planar surface when the subsurface is modified by exposure to a preselected agent, such as an oxidizing agent or an etching agent. In either case, the preselected layer is made with a high concentration of aluminum. This concentration of aluminum makes the preselected layer particularly subject to either oxidation or etching. Etching would leave a void where the preselected layer is removed while oxidation would leave a layer of aluminum oxide. Either process can provide effective optical and electrical current confinement. The concepts of the present invention include both of these processes.

If selective etching is selected as the process to achieve the present invention, the high aluminum layers in layered AlGaAs structures can be obtained with hydrochloric acid or hydrofluoric acid. Because the selective etching process is imperfect, the exposed edges following the etch could resemble the teeth of a comb with the highest aluminum layers being etched deeply into the structure and the lower aluminum layers being etched much less severely. To remove this delicate comb-like structure, the selective etch could be followed by a nonselective etch that would smooth the edges.

With continued reference to FIG. 2, two current blocking layers are illustrated. A first current blocking layer 100 is made of a material that is subject to oxidation in the presence of an oxidizing agent. In certain embodiments of the present invention, this material can be $Al_xGa_{1-x}As$, where x is greater than 0.90. In FIG. 2, a second current blocking layer 104 is also illustrated, but it should be understood that certain implementations of the present invention can utilize only a single current blocking layer. Although the use of two current blocking layers, 100 and 104, can be significantly beneficial in certain embodiments, two layers are not required in every application of the present invention. The central openings, 101 and 105, are portions of the current blocking layers that remain unoxidized and, therefore, are electrically conductive. The oxidized portions of the current blocking layers become electrically insulative and thereby inhibit the flow of electrical current through their thicknesses. As a result, electrical current flowing from the upper contact 26 to the lower contact 14 is forced to pass in the directions represented by the arrows this funneling of the current causes it to flow through a preselected portion of the active region 20 in a manner generally similar to the current path in the prior art laser structures described above.

With continued reference to FIG. 2, if the portion of the laser structure extending above the substrate 12 comprises a plurality of layers with their edges exposed at the side surfaces of the structure, exposure to an oxidizing agent will selectively oxidize those regions which are made of a material that is subject to oxidation and the oxidation will begin at the edges of the structure. By selecting an appropriate oxidizing agent, such as nitrogen gas saturated with water vapor at 80° C., flowing over wafers at 400° C., and by timing the period of oxidation, an annular oxidized structure can be created with unoxidized central regions such as those identified by reference numerals 101 and 105 in FIG. 2. However, a serious manufacturing problem exists with a structure such as that illustrated in FIG. 2. Some means must be provided to permit electrical contact to be made between a source of power 50 and the electrical contacts, 14 and 26. In most structures of this type, electrical contact between the power source 50 and the conductive pad 14 can be easily accomplished. However, because of the extremely small size of the structure extending upward from substrate 12, connection between a source of power 50 and the upper electrical contact 26 is difficult. This difficulty is true regardless of the methodology used to create the current blocking layers, 100 and 104. The present invention provides a means that facilitates the connection between the source of power 50 and the upper electrical contact 26.

Figure 3A:
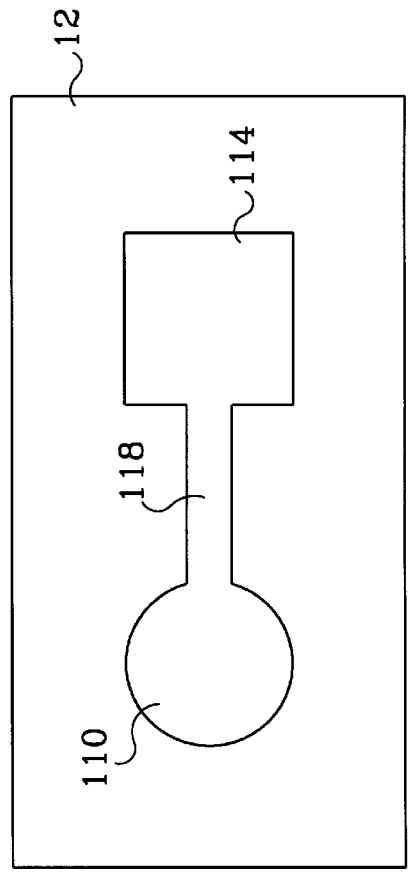
FIGS. 3A and 3B show one embodiment of the present invention.
Figure 3B:
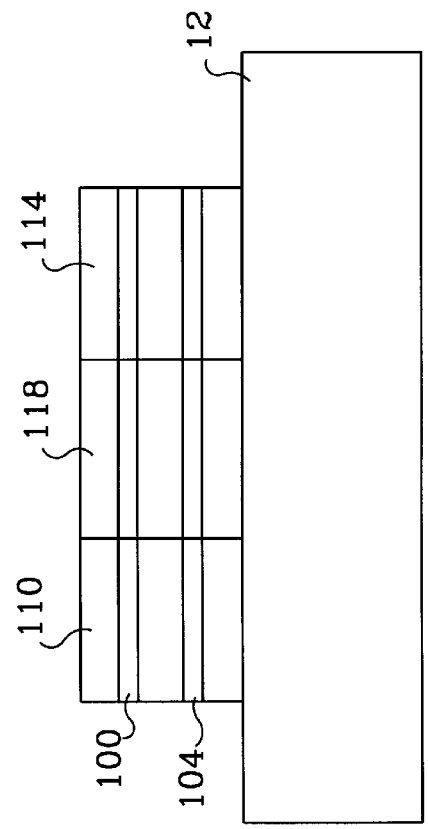

FIG. 3A is a top view of a laser structure made in accordance with the principles of the present invention. The substrate 12 supports a vertical structure that comprises three portions. A lasing portion 110 and a contact support portion 114 are connected by a bridging portion 118. FIG. 3B is a side view of the structure shown in FIG. 3A.

In FIG. 3B, the edges of certain layers of the laser structure are shown. Although it should be understood that the lasing portion 110, the contact support portion 114 and the bridging portion 118 comprise a plurality of layers which form the active region, the upper and lower mirrors, the graded index regions and the contacts, FIG. 3B is a simplified representation that shows only the first and second current blocking layers of the present invention. The first and second current blocking layers, 100 and 104, are placed above and below the active region of the laser structure.

FIGS. 4A and 4B show the same structure described above in conjunction with FIGS. 3A and 3B, but after the current blocking layers have been selectively oxidized. FIG. 4A is a sectional view of FIG. 4B taken through the upper, or first, current blocking layer 100. Since the oxidation of the current blocking layers begins at the edges of the vertical structure on the substrate 12, the oxidation progresses inwardly from those edges when the edges are exposed to an oxidizing agent. The oxidized region grows from the outer edges and, over time, progresses inwardly to surround an unoxidized portion such as those identified above by reference numerals 101 and 105 in FIG. 2. In FIG. 4A, the unoxidized region of the lasing portion 110 is identified by reference numeral 130. Because the oxidation tends to move at a constant rate in all portions of the structure, an unoxidized portion 134 of the contact support portion 114 will also exist. The bridging portion 118, which is smaller in width than the other two portions, is completely oxidized. The degree of oxidation and nonoxidation illustrated in FIG. 4A results from exposing the structure to the oxidizing agent for a preselected period of time that is a function of both the oxidizing agent used and the temperature under which the oxidation process occurs. Many different options are available for these purposes. The nonoxidized portion 130 of the lasing portion 110 provides a current path that directs electrical current through the preselected portion of the active region.

Figure 5A:
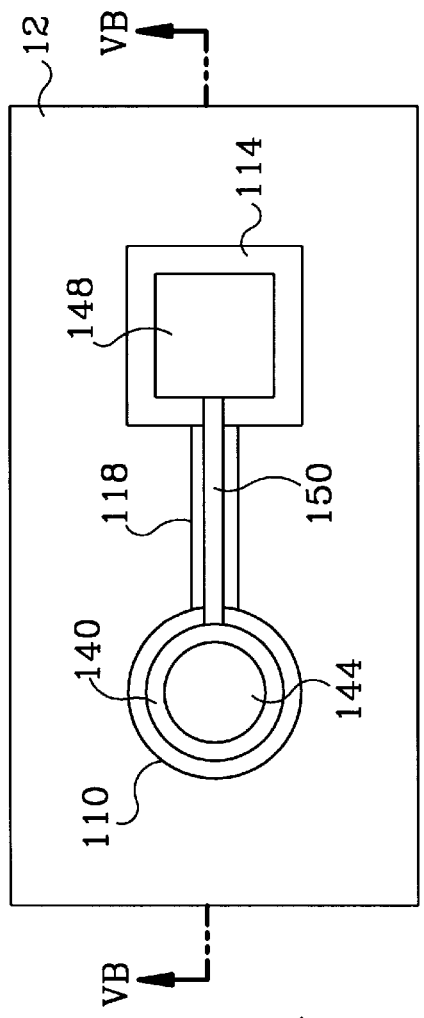
FIGS. 5A and 5B show a later manufacturing stage of the device described in FIGS. 4A and 4B.
Figure 5B:
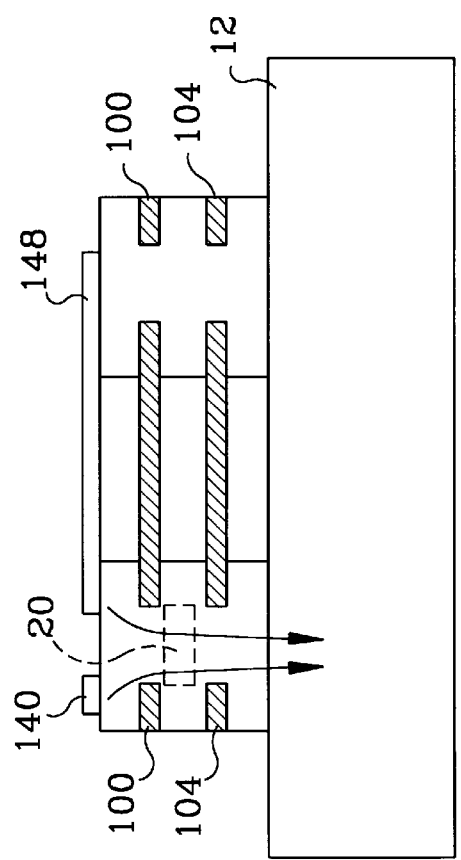

FIGS. 5A and 5B show the structure of FIGS. 4A and 4B after further processing is completed. In FIG. 5A, a conductive material, such as titanium:gold, is deposited on the upper surface of the lasing portion 110, the contact support portion 114 and the bridging portion 118. The electrically conductive material is formed in an annular shape 140 to provide an aperture 144 through which light can be emitting from the lasing portion 110. On the contact support portion 114, the electrical pad 148 is shaped to be large enough to facilitate a connection, by known wire bonding techniques, between the pad 148 and a source of power such as that identified by reference numeral 50 in FIG. 2. Between the annular contact 140 and the connection pad 148, a conductive strip 150 extends across the bridging portion 118. This allows electrical contact between the larger conductive pad 148 and the annular conductor 140 that surrounds the aperture 144.

FIG. 5B is a sectional view of FIG. 5A taken through the center of the lasing portion 110, bridging portion 118 and contact support 114. As a result, the first and second current blocking layers, 100 and 104, are shown with the electrically conductive portion as described above and identified by reference numeral 130 in conjunction with FIG. 4A. This electrically conductive portion of the current blocking layers allows current to flow from the upper contact 140 through the active region 20 as represented by the arrows. Although the size of the lasing portion 110 is extremely small, the larger contact support portion 114 allows a relatively large contact pad 148 to be provided for the purpose of allowing the device to be connected to a source of power by known wire bonding techniques. The bridging portion 118 provides physical support for the electrical conductor 150 as it extends from the contact support portion 114 to the lasing portion 110. An additional step, such as proton implantation in all regions except a small area in and surrounding the lasing region and a small area within the contact pad can provide device to device electrical isolation and minimizes device capacitance.

The embodiment of the present invention shown in FIGS. 3A, 3B, 4A, 4B, 5A and 5B describe one embodiment of the present invention. Another embodiment, which is preferable in certain applications, will be described below.

Figure 6A:
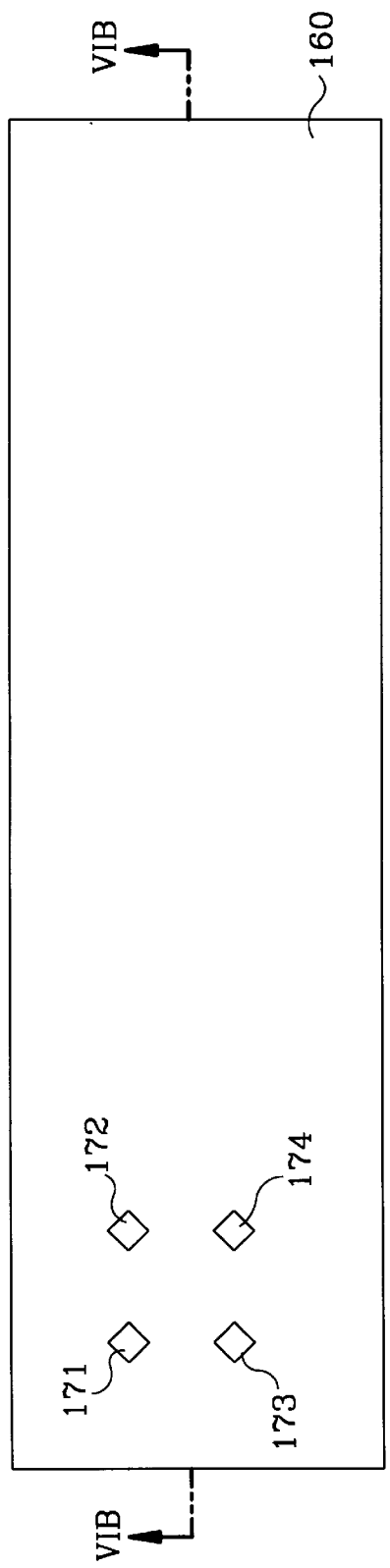
FIGS. 6A and 6B show a second embodiment of the present invention.
Figure 6B:
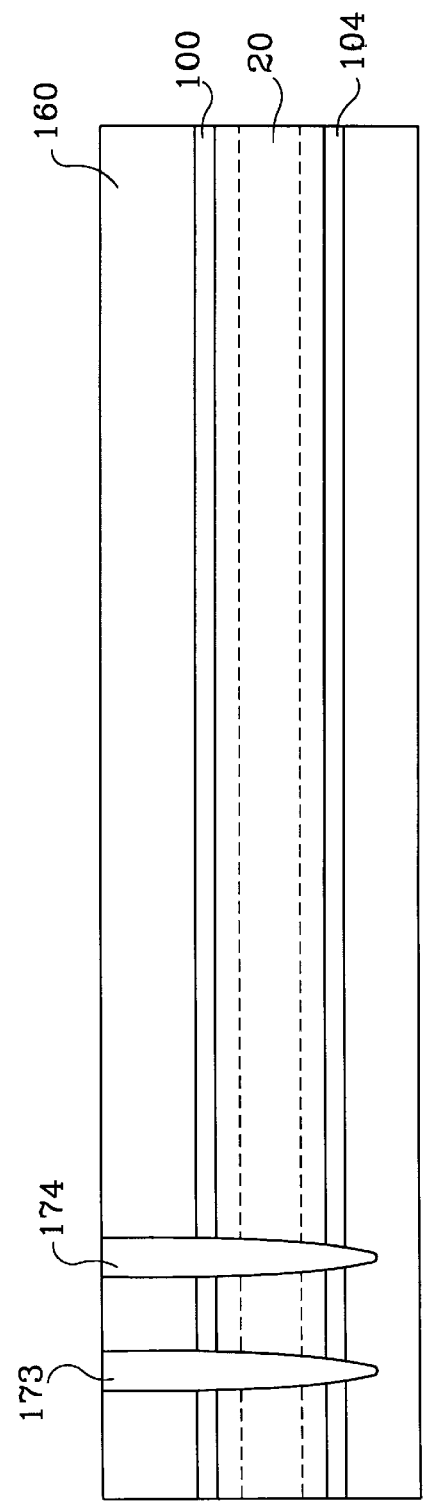

FIG. 6A shows a top view of a laser structure which comprises the known layers described above in conjunction with FIG. 1. The laser structure 160 has a top surface into which a plurality of etched openings, 171–174, extend. FIG. 6B is a sectional view of FIG. 6A and illustrates the exemplary depth to which the openings are etched. The section of FIG. 6A is taken through etched openings 173 and 174. They extend downward through the first current blocking layer 100, the active region 20 and the second current blocking layer 104. Naturally, if a single current blocking layer 100 is used, the etched openings need only extend down ward through it. The presence of the openings, 171–174, exposes an edge of the current blocking layers where they intersect the openings. By disposing an oxidizing agent into the openings, 171–174, these edges of the current blocking layers can be caused to begin oxidation.

FIGS. 7A and 7B show the effect of this process. In FIG. 7B, the current blocking layers, 100 and 104, are shown having oxidized regions 200 and 204. These oxidized regions spread out from the openings, 173 and 174 as a function of time during which the oxidizing agent is within the openings. FIG. 7B is a sectional view of FIG. 7A taken through openings 173 and 174. FIG. 7A, in turn, illustrates a cross section of the device taken through a region at which blocking layer 100 is present. This shows the outward growth of the oxidized regions which are shown as dashed circles and identified by reference numerals 200–203 in FIG. 7A. It should be understood that the outward growth from the openings is not expected to be perfectly circular in most cases. In fact, different oxidation or etch rates in different directions can be exploited to modify the geometry of the unoxidized or unetched regions. However, for purposes of illustrating the basic principles of the present invention, the oxidized regions are illustrated by dashed lines as being generally circular in FIG. 7A. A nonoxidized region is surrounded by the four oxidized circles, 200–203, shown in FIG. 7A. This central unoxidized region is confined by the oxidized regions and serves as the current path that the confined electrical current can follow as it passes downward through the active region 20. In other words, the basic principles of the operation of the device shown in FIGS. 6A, 6B, 7A and 7B is identical to those described above, but the implementation that achieves that mode of operation is different. Rather than expose outer edges of this structure to oxidize the current blocking layers, holes are etched to expose edges within the holes and the oxidation is accomplished by placing an oxidizing agent in the etched holes. Four oxidized patterns are positioned to surround an unoxidized portion as illustrated in FIG. 7A. The beneficial result is similar in both cases.

Figure 8A:
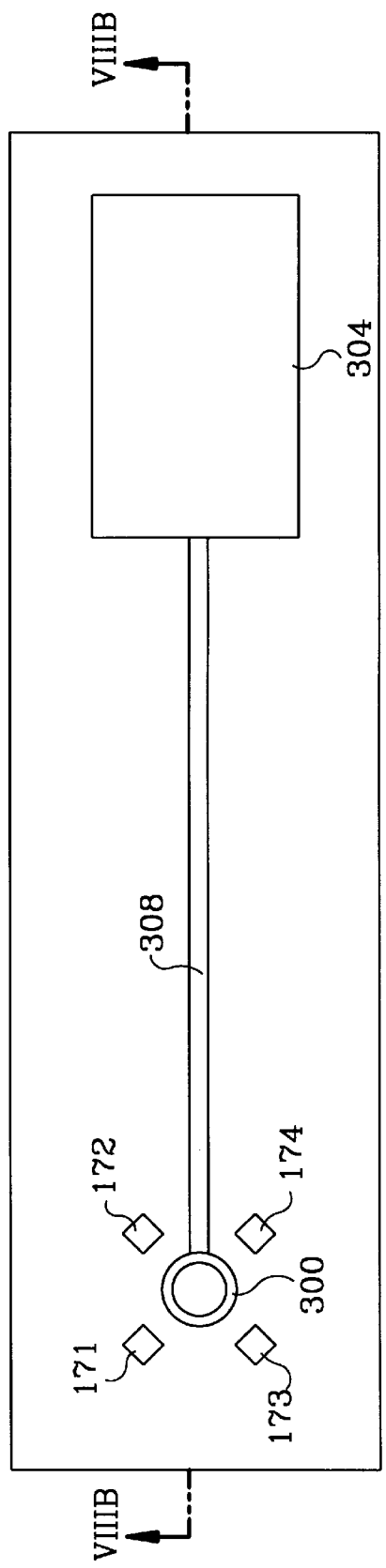
FIGS. 8A and 8B show a later stage of development of the device illustrate FIGS. 7A and 7B.
Figure 8B:
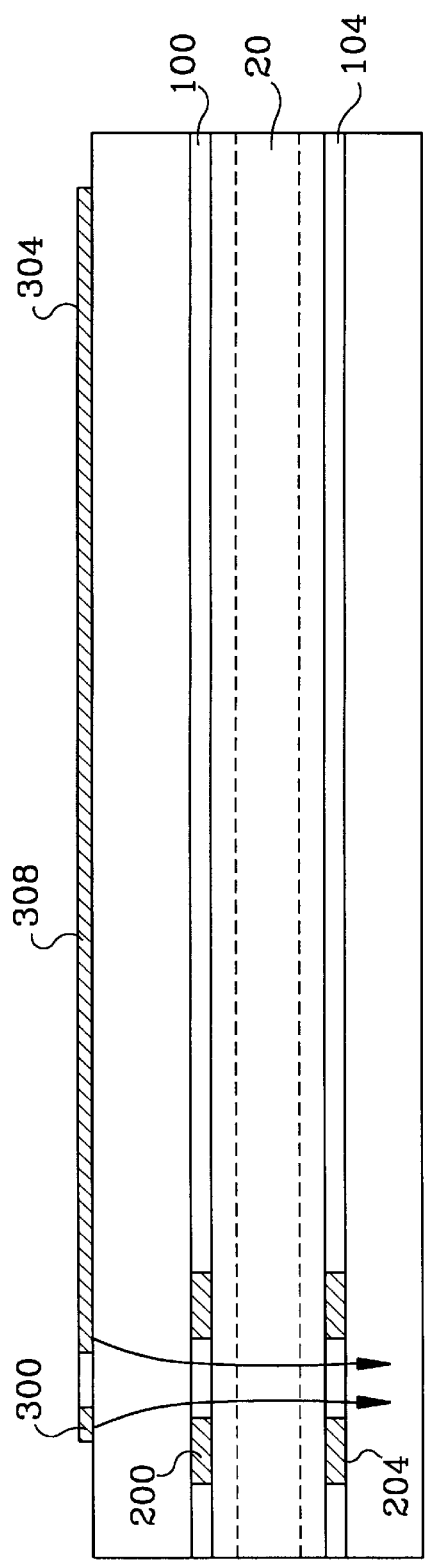

FIGS. 8A and 8B show the device of FIGS. 7A and 7B after further processing. An electrically conductive material, such as titanium:gold is deposited on the upper surface of the device. This material has an annular portion 300 and a larger contact pad 304. These two portions are connected by a strip 308 as shown. An additional step, such as proton implantation in all regions except a small area in and surrounding the lasing region and a small area within the contact pad can provide device to device electrical isolation and minimizes device capacitance. The contacts on the upper surface facilitate the connection to an electrical source by known wire-bonding techniques and provides electrical current which flows downward through the openings in the oxidized regions of the current blocking layers. The flow is represented by arrows in FIG. 8B which is a sectional view of FIG. 8A.

Although the present invention is described in particular detail to illustrate two preferred embodiments of the present invention, it should be understood that alternative embodiments are also within its scope.

The embodiments of the invention in which an exclusive property or right is claimed are defined as follows:

1. A laser structure, comprising:

an active region;

a first electrical contact disposed on a first surface of said laser structure;

a second electrical contact, said active region being disposed between said first and second electrical contacts;

a first current blocking layer, said first current blocking layer being subject to physical change when exposed to a preselected agent;

first means for selectively exposing a portion of said first current blocking layer to said preselected agent to define a first unchanged region of said first current blocking layer surrounded by a first changed region of said first current blocking layer, said first unchanged region of said first current blocking layer being aligned with a preselected region of said active region, said first changed region being electrically insulative, said first unchanged region being electrically conductive;

wherein said first means for selectively exposing includes at least one etched depression extending from said first surface of said laser structure into the body of said laser structure and through said first current blocking layer to expose a portion of said current blocking layer to said preselected agent during manufacture of said laser structure.

2. The laser structure of claim 1, wherein:
   said laser structure is a vertical cavity surface emitting laser.

3. The laser structure of claim 1, further comprising:
   a second current blocking layer, said second current blocking layer being subject to change when exposed to said preselected agent;
   means for selectively exposing a portion of said second current blocking layer to said preselected agent to define a second unchanged region of said second current blocking layer surrounded by a second changed region of said second current blocking layer, said second unchanged region of said second current blocking layer being aligned with said preselected region of said active region, said second changed region being electrically insulative, said second unchanged region being electrically conductive, said first and second unchanged regions being aligned with each other to define a current channel extending through said preselected region of said active region; and
   said means for selectively exposing a portion of said second current blocking layer further comprises at least one etched depression extending from said first surface of said laser into the body of said laser structure and through said second current blocking layer to expose a portion of said second current blocking layer to said preselected agent during manufacture of said laser structure.

4. The laser structure of claim 1, wherein:
   said laser structure comprises a substrate portion, a lasing portion disposed on said substrate portion, a contact support portion disposed on said substrate portion, and a bridging portion disposed on said substrate portion, said bridging portion connected between said lasing portion and said contact support portion, said first current blocking layer being exposed at a surface of said lasing portion.

5. The laser structure of claim 3, wherein:
   said laser structure comprises a substrate portion, a lasing portion disposed on said substrate portion, a contact support portion disposed on said substrate portion, and a bridging portion disposed on said substrate portion, said bridging portion connected between said lasing portion and said contact support portion, said first and second current blocking layers being exposed at a surface of said lasing portion.

6. The laser structure of claim 1, wherein:
   said preselected agent is an oxidizing agent and said physical change is oxidation.

7. The laser structure of claim 6, wherein:
   said oxidizing agent is water vapor.

8. The laser structure of claim 1, wherein:
   said preselected agent is an etchant.

9. The laser structure of claim 8, wherein:
   said etchant is an acid.

10. The laser structure of claim 1, wherein said first means for selectively exposing further comprises:
   four etched depressions extending from said first surface of said laser structure into the body of said laser structure and through said first current blocking layer to expose a plurality of portions of said current blocking layer to said preselected agent during manufacture of said laser structure.

11. The laser structure of claim 1, further comprising:
   an first mirror structure comprising a first plurality of layers;

a second mirror structure comprising a second plurality of layers, said active region being disposed between said first and second mirror structures.

12. The laser structure of claim 3, wherein:

said means for selectively exposing a portion of said second current blocking layer further comprises four etched depressions extending from said first surface of said laser structure into the body of said laser structure and through said second current blocking layer to expose a plurality of portions of said second current blocking layer to said preselected agent during manufacture of said laser structure.

13. A laser structure, comprising:

an active region;

a first electrical contact disposed on a first surface of said laser structure;

a second electrical contact, said active region being disposed between said first and second electrical contacts, said laser structure being a vertical cavity surface emitting laser;

a first current blocking layer, said first current blocking layer being subject to oxidation when exposed to an oxidizing agent;

a second current blocking layer, said second current blocking layer being subject to oxidation when exposed to said oxidizing agent;

a first means for selectively exposing a portion of said first current blocking layer to said oxidizing agent to define a first nonoxidized region of said first current blocking layer surrounded by a first oxidized region of said first current blocking layer, said first nonoxidized region of said first current blocking layer being aligned with a preselected region of said active region, said first oxidized region being electrically insulative, said first nonoxidized region being electrically conductive;

second means for selectively exposing a portion of said second current blocking layer to said oxidizing agent to define a second nonoxidized region of said second current blocking layer surrounded by a second oxidized region of said second current blocking layer, said second nonoxidizing region of said second current blocking layer being aligned with said preselected region of said active region, said second oxidized region being electrically insulative, said second nonoxidized region being electrically conductive, said first and second nonoxidized regions being aligned with each other to define a current channel extending through said preselected region of said active region; and wherein said first means for selectively exposing and said second means for selectively exposing include at least one etched depression extending from said first surface of said laser structure into the body of said laser structure and through said first and second current blocking layers to expose a portion of said first and second current blocking layers to said preselected agent during manufacture of said laser structure.

14. The laser structure of claim 13, wherein:

said laser structure comprises a substrate portion, a lasing portion disposed on said substrate portion, a contact support portion disposed on said substrate portion, and a bridging portion disposed on said substrate portion, said bridging portion connected between said lasing portion and said contact support portion, said first and second current blocking layers being exposed at a surface of said lasing portion.

15. The laser structure of claim 14, wherein:

said first and second current blocking layers comprise an aluminum bearing material.

16. The laser structure of claim 14, wherein:

said oxidizing agent is water vapor.

17. The laser structure of claim 13, wherein:

said first and second means for selectively exposing further include four etched depressions extending from said first surface of said laser structure into the body of said laser structure and through said first and second current blocking layers to expose a plurality of portions of said current blocking layers to said preselected agent during manufacture of said laser structure.

18. A laser structure, comprising:

an active region;

a first electrical contact disposed on a first surface of said laser structure;

a second electrical contact, said active region being disposed between said first and second electrical contacts, said laser structure being a vertical cavity surface emitting laser;

a first current blocking layer, said first current blocking layer being subject to oxidation when exposed to an oxidizing agent;

a second current blocking layer, said second current blocking layer being subject to oxidation when exposed to said oxidizing agent;

first means for selectively exposing a portion of said first current blocking layer to said oxidizing agent to define a first nonoxidized region of said first current blocking layer surrounded by a first oxidized region of said first current blocking layer, said first nonoxidized region of said first current blocking layer being aligned with a preselected region of said active region, said first oxidized region being electrically insulative, said first nonoxidized region being electrically conductive;

second means for selectively exposing a portion of said second current blocking layer to said oxidizing agent to define a second nonoxidized region of said second current blocking layer surrounded by a second oxidized region of said second current blocking layer, said second nonoxidized region of said second current blocking layer being aligned with said preselected region of said active region, said second oxidized region being electrically insulative, said second nonoxidized region being electrically conductive, said first and second nonoxidized regions being aligned with each other to define a current channel extending through said preselected region of said active region; and wherein said first and second means for selectively exposing further comprise at least one etched depression extending from said first surfaces of said laser structure into the body of said laser structure and through said first and second current blocking layers to expose a portion of said current blocking layers to said preselected agent during manufacture of said laser structure.

19. The laser structure of claim 18, wherein:

said laser structure comprises a substrate portion, a lasing portion disposed on said substrate portion, a contact support portion disposed on said substrate portion, and a bridging portion disposed on said substrate portion, said bridging portion connected between said lasing portion and said contact support portion, said first and second current blocking layers being exposed at a surface of said lasing portion, said first and second current blocking layers comprise an aluminum bearing material, said oxidizing agent being water vapor.

20. The laser structure of claim 18, further comprising:

a plurality of etched depressions extending from said first surface of said laser structure into the body of said laser structure and through said first current blocking layer to expose a plurality of portions of said current blocking layer to said oxidizing agent during manufacture of said laser structure.

21. The laser structure of claim 18, wherein:

the first and second means for exposing further include four etched depressions extending from said first surface of said laser structure into the body of said laser structure and through said first and second current blocking layers to expose a plurality of portions of said current blocking layers to said preselected agent during manufacture of said laser structure.

\* \* \* \* \*